(12) United States Patent
Pupalaikis et al.

(10) Patent No.: US 8,566,058 B2
(45) Date of Patent: Oct. 22, 2013

(54) METHOD FOR DE-EMBEDDING DEVICE MEASUREMENTS

(75) Inventors: Peter J. Pupalaikis, Ramsey, NJ (US); Kaviyesh Doshi, Pearl River, NY (US)

(73) Assignee: Teledyne LeCroy, Inc., Thousand Oaks, CA (US)

( * ) Notice: Subject to any disclaimer, the term of this patent is extended or adjusted under 35 U.S.C. 154(b) by 416 days.

(21) Appl. No.: 12/418,645

(22) Filed: Apr. 6, 2009

(65) Prior Publication Data
US 2010/0256955 A1 Oct. 7, 2010

(51) Int. Cl.
G06F 17/50 (2006.01)
G06F 19/00 (2011.01)
G01R 27/28 (2006.01)

(52) U.S. Cl.
USPC ............... 702/109; 702/189; 324/638

(58) Field of Classification Search
USPC ................. 702/189, 109; 324/638
See application file for complete search history.

(56) References Cited

U.S. PATENT DOCUMENTS

| | | |
|---|---|---|
| 6,665,628 B2 | 12/2003 | Martens |
| 6,744,262 B2 | 6/2004 | Adamian |
| 6,961,669 B2 | 11/2005 | Brunsman |
| 2005/0234661 A1 * | 10/2005 | Taylor ............. 702/57 |

OTHER PUBLICATIONS

Agilent Technologies, "S-Parameter Design", Application Note 154, Nov. 2000, pp. 1-14 http://cp.literature.agilent.com/litweb/pdf/5952-1087.pdf.*
Agilent, "De-embedding and Embedding S-Parameter Networks Using a Vector Network Analyzer", May 30, 2004, Application Note 1364-1, pp. 3-7 http://cp.literature.agilent.com/litweb/pdf/5980-2784EN.pdf.*
"De-Embedding Techniques in Advanced Design System", *Agilent Technologies*, (2006), 1-35.
Wittwer, Peter et al., "A General Closed-Form Solution to Multi-Port Scattering Parameter Calculations", *72nd ARFTG Conference Digest*, (Dec. 2008), 1-7.
"De-Embedding Techniques with Z, Y, S, A Matrices", *Modeling Toolkits 3 DEEMB.WPS -si-*, (May 19, 2002), 1-15.
"Embedding/De-embedding", *Application Note Anritsu*, 1-16.
"RF Toolbox 2 User's Guide", *Matlab The Mathworks*, 1-649.
Agili, Sedig et al., "De-Embedding Techniques in Signal Integrity: A Comparison Study", *2005 Conference on Information Sciences and Systems The Johns Hopkins University*, (Mar. 2005), 1-6.

* cited by examiner

*Primary Examiner* — Sujoy Kundu
*Assistant Examiner* — Regis Betsch
(74) *Attorney, Agent, or Firm* — Gordon Kessler

(57) ABSTRACT

A method is provided for de-embedding measurements from a given network containing mixtures of devices with known and unknown S-parameters given a description of the network and the known S-parameters of the overall system.

18 Claims, 6 Drawing Sheets

---

Given:

1. Internal system description D

2. Known system S-parameters $S_k$

Perform the following steps:

1. Generate a known system characteristics matrix in canonical form $\hat{E}$ and vector of names vn from D.

2. Generate vectors $v_r$ and $v$ containing the desired row and column ordering, respectively.

3. Generate permutation matrices $P_r$ and $P_c$.

4. Generate known system characteristics matrix E as $P_r \hat{E} P_c^T$.

5. Generate $Ei = E^{-1}$

6. Generate $B = -Ei_{40}^{\dagger}(Ei_{43} - S_k)$

7. Generate $A = Ei_{03} + Ei_{00}B$ 8. for each device whose S-parameters are unknown, $m \in \{0, \ldots, M\}$, generate the S-parameters as $S_{um} = B_m A_m^{\dagger}$

Given:

1. Internal system description $\mathbf{D}$
2. Known system S-parameters $\mathbf{S_k}$

Perform the following steps:

1. Generate a known system characteristics matrix in canonical form $\widehat{\mathbf{E}}$ and vector of names $\mathbf{vn}$ from $\mathbf{D}$.
2. Generate vectors $\mathbf{v_r}$ and $\mathbf{v}$ containing the desired row and column ordering, respectively.
3. Generate permutation matrices $\mathbf{P_r}$ and $\mathbf{P_c}$
4. Generate known system characteristics matrix $\mathbf{E}$ as $\mathbf{P_r}\widehat{\mathbf{E}}\mathbf{P_c}^T$.
5. Generate $\mathbf{Ei} = \mathbf{E}^{-1}$
6. Generate $\mathbf{B} = -\mathbf{Ei_{40}}^\dagger (\mathbf{Ei_{43}} - \mathbf{S_k})$
7. Generate $\mathbf{A} = \mathbf{Ei_{03}} + \mathbf{Ei_{00}}\mathbf{B}$
8. for each device whose S-parameters are unknown, $m \in \{0, \ldots, M\}$, generate the S-parameters as $\mathbf{S_{u}}_m = \mathbf{B}_m \mathbf{A}_m^\dagger$

FIG. 1

```
13 — .Device D1 4 file "FixtureLeftHalf.s4p"
14 — .Device D2 4 file "FixtureRightHalf.s4p"
15 — .Device ?1 2 Unknown
16 — .Port 1 D1 1
19 — .Port 4 D2 1
17 — .Port 2 D1 2
18 — .Port 3 D2 2
20 — .Node D1 3 ?1 1 D2 3
21 — .Node D1 4 ?1 2 D2 4
```

| Device | Member Access | | | Data | Device | Member Access | | | Data |
|---|---|---|---|---|---|---|---|---|---|
| 0 | Name | | | D1 | 6 | Name | | | TP4 |
| | Ports | 0 | A | #22 | | Ports | 0 | A | #32 |
| | | | B | #21 | | | | B | #31 |
| | | 1 | A | #62 | | | 1 | A | #41 |
| | | | B | #61 | | | | B | #42 |
| | | 2 | A | #101 | | S | | | Ideal Thru |
| | | | B | #102 | 7 | Name | | | P2 |
| | | 3 | A | #131 | | Ports | 0 | A | #51 |
| | | | B | #132 | | | | B | #52 |
| | S | | | File "fixtureLeftHalf.s4p" | | S | | | Ideal Termination |
| 1 | Name | | | D2 | 8 | Name | | | TP2 |
| | Ports | 0 | A | #42 | | Ports | 0 | A | #52 |
| | | | B | #41 | | | | B | #51 |
| | | 1 | A | #82 | | | 1 | A | #61 |
| | | | B | #81 | | | | B | #62 |
| | | 2 | A | #112 | | S | | | Ideal Thru |
| | | | B | #111 | 9 | Name | | | P3 |
| | | 3 | A | #142 | | Ports | 0 | A | #71 |
| | | | B | #141 | | | | B | #72 |
| | S | | | File "fixtureRightHalf.s4p" | | S | | | Ideal Termination |
| 2 | Name | | | ?1 | 10 | Name | | | TP3 |
| | Ports | 0 | A | #92 | | Ports | 0 | A | #72 |
| | | | B | #91 | | | | B | #71 |
| | | 1 | A | #122 | | | 1 | A | #81 |
| | | | B | #121 | | | | B | #82 |
| | S | | | unknown | | S | | | Ideal Thru |
| 3 | Name | | | P1 | 11 | Name | | | T1 |
| | Ports | 0 | A | #11 | | Ports | 0 | A | #91 |
| | | | B | #12 | | | | B | #92 |
| | S | | | Ideal Termination | | | 1 | A | #102 |
| 4 | Name | | | TP1 | | | | B | #101 |
| | Ports | 0 | A | #12 | | | 2 | A | #111 |
| | | | B | #11 | | | | B | #112 |
| | | 1 | A | #21 | | S | | | Ideal Tee |
| | | | B | #22 | 12 | Name | | | T2 |
| | S | | | Ideal Thru | | Ports | 0 | A | #121 |
| 5 | Name | | | P4 | | | | B | #122 |
| | Ports | 0 | A | #31 | | | 1 | A | #132 |
| | | | B | #32 | | | | B | #131 |
| | S | | | Ideal Termination | | | 2 | A | #141 |
| | | | | | | | | B | #142 |
| | | | | | | S | | | Ideal Tee |

FIG. 5

| VN | CO | | RO | |
|---|---|---|---|---|
| #21 | A | #92 | B | #91 |
| #61 | | #122 | | #121 |
| #102 | B | #91 | A | #92 |
| #132 | | #121 | | #122 |
| #41 | U | #22 | U | #22 |
| #81 | | #62 | | #62 |
| #111 | | #101 | | #101 |
| #141 | | #131 | | #131 |
| #91 | | #42 | | #42 |
| #121 | | #82 | | #82 |
| #12 | | #112 | | #112 |
| #11 | | #142 | | #142 |
| #22 | | #21 | | #21 |
| #32 | | #41 | | #41 |
| #31 | | #61 | | #61 |
| #42 | | #81 | | #81 |
| #52 | | #102 | | #102 |
| #51 | | #111 | | #111 |
| #62 | | #132 | | #132 |
| #72 | | #141 | | #141 |
| #71 | Amsd | #12 | Amsd | #12 |
| #82 | | #52 | | #52 |
| #92 | | #72 | | #72 |
| #101 | | #32 | | #32 |
| #112 | Bmsd | #11 | Bmsd | #11 |
| #122 | | #51 | | #51 |
| #131 | | #71 | | #71 |
| #142 | | #31 | | #31 |

FIG. 6

METHOD FOR DE-EMBEDDING DEVICE MEASUREMENTS

FIELD OF THE INVENTION

The present invention relates in general to the measurement of characteristics of electronic networks and in particular to de-embedding measurements.

BACKGROUND OF THE INVENTION

In the field of measurement, it is useful to characterize devices. In this context, a device is defined as a network containing ports. The behavior of the device can be described as the relationship between signals on ports and how these signals are affected as they pass through the various ports of the device. The device that is being characterized is termed the device under test or DUT.

As is known to those of ordinary skill in the art of high-speed electronics, a useful method of describing a system is through the provision of scattering parameters (S-parameters). As is known to those skilled in the art of microwave measurements, S-parameters define the port-to-port relationship of a network in the relationship Sa=b where S is a complex matrix that is provided for a variety of frequencies, a is a vector of incident waves on the device ports and b is a vector of reflected waves. There are many different types of network parameters such as Y, ABCD, Z, etc. Mostly, these types of network parameters are interchangeable and are simply different ways of describing similar behavior.

The characterization of devices is preferably performed using network analyzers, although other methods of characterization may be appropriate. Network analyzers launch waves into a device and measure the reflected waves. This is accomplished either by generating and measuring sinusoids at a given frequency, as in the vector network analyzer (VNA) or by launching and measuring reflected fast rise-time pulses, steps, or impulses as in time-domain reflectometry (TDR). Either way, the same information is obtained.

One particular difficulty that arises is that both the system and the testing device are actual, physical systems. In any such system often the connections that are made to the VNA or TDR are restricted because these systems must be built for general purpose use, and are designed in advance of any particular measurement desired by a particular user at a particular time. Often, connection methods are restricted to coaxial connections or the sex of the connection is restricted to either male or female. Therefore, if the device being characterized does not employ the required connectors, then an adapter or fixture must be created to connect the device to the measurement instrument. This fixture must either be of such high quality that it can be neglected, or it must be de-embedded from the measurement, thus allowing the user to characterize the system as if the fixture and measurement devices did not exist. De-embedding, in this context, is therefore the act of undoing or removing the effects of known fixturing or other elements to extract only the measurement of interest, and to insure that this measurement is free of any influence imposed by the measurement system or technique employed.

Even if the measurement instrument connections can be adapted to the DUT, usually these instruments are calibrated prior to use using a variety of methods, most involving the use of known standards or known relationships in standards. Standards usually come in specific forms, the most generally used being coaxial calibration standard kits or electronic calibration modules that are also coaxial in connection method. Therefore, regardless of connection capability to a DUT, often the calibration reference plane is limited to where suitable connection of standards can be made.

Many modern measurement instruments provide methods to gate the measurement. Gating is usually performed as time gating. Time gating is the method whereby the time through various fixtures and connections is known or can be inferred by observation. Gating theoretically moves the reference plane from the calibration and connection point past the fixturing to the boundaries of the DUT. This method does not perform a complete de-embedding in the sense that the entire behavioral model of the DUT cannot be extracted. In other words, gating is used to move the reference plane for some S-parameter measurements but does not move it for all measurements, and therefore does not obtain a complete de-embedded model of the DUT.

The reason that the complete de-embedded model is useful is because, when characterizing devices, one is usually trying to take a measurement that will determine the performance of the device when later used in a different environment. Usually this final performance will be that of the DUT in another system, and therefore it would be beneficial to know how the device will affect the overall performance of that other system. Test and measurement engineers take and analyze measurements that somehow correlate with final performance. Sometimes the measurement is simply a pass-fail test. In these cases, gated measurements are usually good enough. That being said, there are many examples of measurements that are too complex to be handled through this relatively simple method. More importantly, often the aim in the device characterization is to obtain a behavioral model of the device. As stated previously, the network parameters of a device can be thought of as completely defining how the device will perform. Systems are so complex nowadays that often, the way of measuring how a device will perform is to generate a model of the device and use it in a simulation. A simple example of this is in the design of high-speed communication channels. In this case, the S-parameter measurements provide indications of how the channel will perform, but a preferred way is to use a model of the channel in a simulation (along with models of the other components) and actually see how the channel behaves in the simulation, measuring directly the primary criteria like bit error rate, for example. In cases like this, the measurement instrument is required to provide not just a chart or graph, but a usable model. In this case, a gated measurement is not adequate, and to get a truly accurate model, the behavioral model of the DUT needs to be de-embedded from fixturing.

There are many known methods of de-embedding. It is a mathematical exercise. The methods involve first measuring a system from its periphery. In other words, a system is measured containing (known) fixtures and the (unknown) DUT. Then, attempts are made to mathematically remove known elements portion by portion. Prior approaches of de-embedding can be broadly divided into two categories. In one approach, de-embedding proceeds by converting S-parameters of the system and known elements to some form of cascadable parameters e.g. T-parameters, ABCD parameters etc., inverting these parameter matrices and multiplying them by the measured parameters of the system. Despite the fact that many methods exist for doing this, it is a problematic exercise. Sometimes, the nature of the system makes this process difficult, such as when systems of even or odd numbers of ports are involved. The application of cascadable parameter techniques to de-embedding is situational. In other words, each de-embedding problem is a new problem to be solved and requires a special strategy that depends on each new topology encountered.

In U.S. Pat. No. 6,744,262, article Application Note Embedding/De-embedding—Simulated removal and insertion of fixtures, matching and other networks, November 2001, and U.S. Pat. No. 6,665,628, the measured S-parameters of the system are converted into T-parameters. The system T-parameters are then written as a cascade of known fixture T-parameters and unknown DUT T-parameters. The DUT is then de-embedded by inverting the T-parameters of the fixtures. Such a method has several drawbacks. The conversion to T-parameters requires a careful examination of the circuit configuration and identification of "input" and "output" ports, along with a careful numbering of ports for each different circuit configuration. This makes the algorithm difficult to automate for any given circuit. The conversion also puts a restriction on the number of ports of a DUT e.g it has to be even or divisible by 4 etc.; or a restriction on the nature of fixtures e.g. fixtures are required to have even number of ports. In U.S. Pat. No. 6,961,669, the measured S-parameters are converted into ABCD-parameters. These parameters are carefully partitioned and then arranged in cascade equation to de-embed the unknown DUT. This approach suffers from the same drawbacks as the conversion to T-parameters approach. In general, T-parameter approaches have problems with the numbers of ports and are difficult to automate.

Another category of solutions to this problem involves careful manipulation of the circuit parameters to de-embed the DUT. Such an approach is generally restrictive to certain types of fixtures or for DUTs with fewer ports. Each different circuit model or fixture requires a new set of rules to de-embed the DUT. In the tool RF toolbox, *The MathWorks*, Natick Mass. only two port DUTs with a certain kind of fixture is considered. U.S. Pat. No. 6,211,541 considers a problem pertaining to integrated circuits (ICs) with specific type of "fixtures"—that arising from the leads of the IC. In article 3.3.4.3 *De-embedding techniques with Y, Z, S, A matrices*, the explanation is limited to two port networks as the DUT. The "fixtures" considered, are circuits made up of some combination of inductors and capacitors. And de-embedding is performed through clever circuit manipulation. Such a method is difficult to automate, and one needs to look at different fixtures and DUT combinations as new problems to be solved.

In *De-embedding techniques in signal integrity: A comparison study*, 2005 *conference on Information Sciences and System*, The Johns Hopkins University, Mar. 16-18, 2005, the authors compare four different techniques of de-embedding. The four techniques are listed here for completeness. G. Antonini, A. Ciccomancini Scogna and A. Orlandi, "*S-Parameter Characterization of Through, Blind, and Burned Via Holes,*" IEEE Trans. on Mobile Computing, vol. 2, no. 2, April-June 2003 uses the conversion to T-parameters approach described above. J. Song, F. Ling, G. Flynn, W. Blood and E. Demircan, "*A De-embedding Technique for Interconnects,*" Proceedings of the Electrical Performance of Electronic Packaging, 2001 uses careful manipulation of circuit admittances and impedances. Such methods as pointed out earlier are specific to certain problems and cannot be considered as general solutions. L. V. Hauwermetren, M. Botte and D. De Zutter, "*A New De-embedding technique for On-Board Structure Applied to Bandwidth Measurement of Package,*" IEEE Trans. On Components, Hybrids and Manufac. Tech., vol. 16, no. 3, May 1993. uses $S_{21}$ parameter of the system and the fixture to recover the $S_{21}$ parameter of the DUT. The authors use the Fourier transform property of multiplication in frequency domain instead of convolution in time domain. The obvious drawback is that the other S-parameters of the DUT cannot be recovered using this approach. H. Chang, C. Kuo and T. Wu, "*A Time-Domain Approach to Extract SPICE-compatible Equivalent Circuit Models for embedded interconnects*", 2002 IEEE International Symposium on Electromagnetic Compatibility, and C. Schuster and W. Fichner, "*Signal Integrity Analysis using the Finite Difference Time Domain (FDTD) method and layer peeling techniques*", IEEE Transactions on Electromagnetic Compatibility, Vol. 42, No. 2, May 2000. use the time gating technique to make measurements in the time-domain.

Another technique is tuning. One can view the problem as one of simulating the S-parameters of the total system in a certain topology and comparing the simulated S-parameters to the known measured S-parameters on the periphery. In this manner, the S-parameters of the unknown DUT can be varied until the simulated S-parameters of the system match. This method is usable and generates the desired results, but it is an iterative process. Iterative processes like this are not guaranteed to converge to an answer. In many cases, the solution is a gradient walk or Newton's method. There is no way to prove that answers obtained in this manner are in fact the best answer possible.

None of the current approaches can handle more than one unknown DUT.

Therefore, the inventors of the present invention have determined that what is needed is a method of measuring a system at its boundaries and solving directly for the network parameters of a single device or multiple unknown devices in a network.

The inventors of the present invention have determined that what is further needed is a method of performing this calculation whereby the user provides only the known measurements of the overall system, a description of the network topology containing the known and unknown elements, and the characteristics of the known devices.

The inventors of the present invention have determined that what is additionally needed is a tool that performs this calculation without reexamination of the topology on each application.

The inventors of the present invention have determined that what is further additionally needed is a method that contains any feasible number of ports.

The inventors of the present invention have determined that none of the calculation methods noted above meet these needs, or other needs of the industry in this area.

SUMMARY OF THE INVENTION

It is therefore an object of the invention to provide a method that overcomes the drawbacks of the prior art.

In accordance with the invention, a method is provided whereby measurements of a single or multiple unknown elements in a system are determined given known measurements of overall system network parameters and known elements in the system along with a simple description describing the interrelated connections between the known and unknown devices. This method is preferably a method that is not iterative in nature and solves directly in a closed-form solution for the best solution possible.

In order to overcome the problems of de-embedding complete device measurements inherent in the prior art methods described above, a method in accordance with the present invention is provided that preferably takes only a net-list, which is a text or other computer readable form of description of a de-embedding problem, and a set of known S-parameters that describe a measurement of a full system, presumably containing fixturing and other networks described in the net-list. Then the net-list is parsed and converted into an internal representation of the system described by the net-list. Any S-parameters of known elements in the net-list are associated with the elements of the system description. Then the system description is treated mathematically using a process that will be described in greater detail below to produce the S-parameters of the unknown elements in the net-list.

As will be seen, the present method can therefore deal with virtually any net-list representing virtually any known de-embedding problem including over-constrained solutions (systems with more known measurements than unknown S-parameters), and de-embedding situations containing more than one unknown element.

Still other objects and advantages of the invention will in part be obvious and will in part be apparent from the specification and drawings.

The invention accordingly comprises the several steps and the relation of one or more of such steps with respect to each of the others, and the apparatus embodying features of construction, combinations of elements and arrangement of parts that are adapted to affect such steps, all is exemplified in the following detailed disclosure, and the scope of the invention will be indicated in the claims.

BRIEF DESCRIPTION OF THE DRAWINGS

For a more complete understanding of the invention, reference is made to the following description and accompanying drawings, in which:

FIG. 1 provides a preferred algorithm in accordance with a preferred method according to the present invention;

FIG. 5 shows the internal structure of a system description that corresponds to FIG. 3;

FIG. 6 shows the node ordering and the desired row and column ordering corresponding to FIG. 5.

DETAILED DESCRIPTION OF THE PREFERRED EMBODIMENTS

Figures 2, 3:
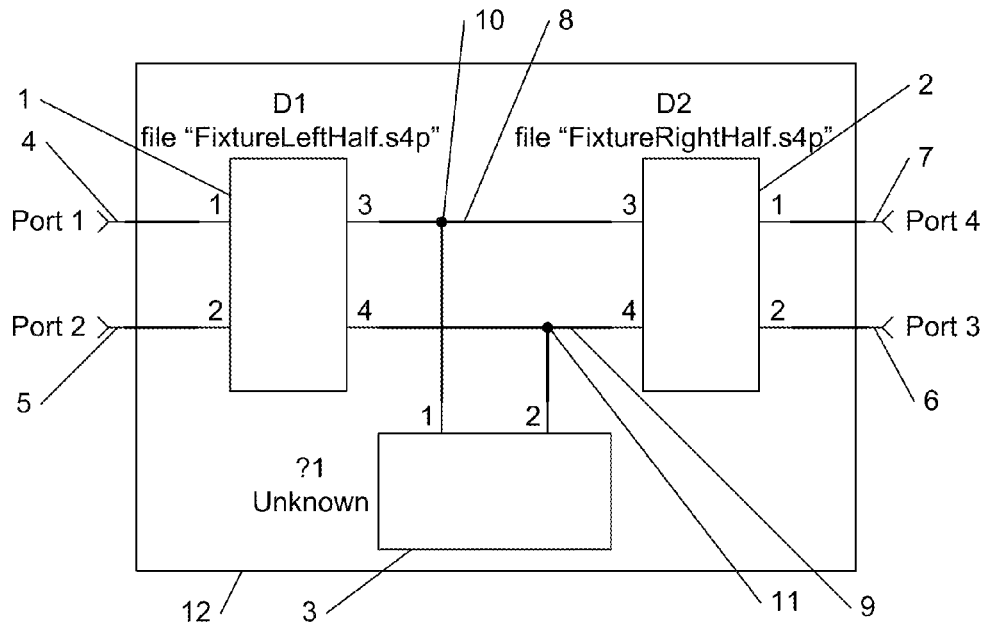
FIG. 2 shows a system and an exemplary de-embedding problem.
FIG. 3 shows a net-list that corresponds to the system depicted in FIG. 2.

A detailed description of the invention will now be provided, making reference to the attached drawings in which like reference numbers refer to like structure or steps.

In accordance with the present invention, one is preferably provided with a system description and a set of known S-parameters measured at ports of this system. These various system descriptions are determined in a manner known to one of ordinary skill in the art, and may be provided in accordance with various known testing or mathematical model methods. In accordance with the invention, such a system description is considered to be an abstract term representing a description of a network. A network is comprised of devices, nodes, and system ports. A device is defined abstractly as a box with ports. Every device has a name, ports, and characteristics. A device's name is unique and serves to identify it within the network. The ports of the device are where signals enter and exit the device. The characteristics of the device describe the port-to-port relationships. Understand that there are many equivalent ways to define port-to-port relationships. These ways are described in the field of network analysis, and are readily apparent to those of ordinary skill in the art.

Without loss of generality, the present method will refer to device characteristics using S-parameters, so the port-to-port relationships are described for each frequency of interest as a complex matrix describing the relationship between incident and reflected waves on all device ports. A node is defined as a connection between two device ports. While a node, as far as the user is concerned, may represent a connection of more than one device port, it is understood that in reality, only two device ports can be connected and in fact a connection of more than one device port is actually a connection between the plurality of device ports and a device called an ideal-tee. This will be explained in subsequent sections. Internally, since S-parameters have been chosen, without loss of generality, as the method of describing device characteristics, there are actually two nodes for every pair of device port connections. One node represents the path for a wave reflected from one device port and incident on another and vice-versa. The user need not be concerned with this in a node specification and is only required to specify the connections between device ports. This means that a connection between two device ports is, to the user, considered a single node while internally it is considered as two nodes. The definition of a node shall be clear within the context of its use. A system port is a port that connects to the entire system. A system port is where signals enter and exit the entire system. In some cases within this document, the word port will refer to a system port or a device port where the context will make it clear to which type of port it refers. A system port has a unique number associated with it that must be spelled out by the user. The known S-parameters provided refer to the known port-to-port relationships between the system ports as numbered. The explanations provided refer often to a system description. It shall be clear that the concept of a system description refers equally to graphical descriptions of the problem, text or other logical definitions of a graphical problem, and to an internal description of the problem for which an algorithm can be applied. Which meaning of system description is applied shall be clear within the context of any explanation.

As mentioned previously, the user of this method provides a description of the system and the known S-parameters of the system. The S-parameters of the unknown devices specified in the description are calculated in two steps when viewed macroscopically. The first step is of converting the system description into an internal usable form. The second step is of solving for the unknown S-parameters given this description in an internal usable form. A clearer understanding of the present method is gained by describing the second step prior to describing the first step. Therefore, the detailed description first shows how to carry out the second step of converting a system description in an internally usable form into the S-parameters of the unknown device or devices; it then serves to describe the first step of converting a user defined system description in graphical or textual form into an internally usable system description.

The detailed explanation continues with a derivation of the algorithm that calculates the unknown S-parameters given a system description in an internal form and the known S-parameters of the system. The yet to be described internal system description is denoted by D. Without explaining the nature of this internal system description, understand that if one is provided with a description of a circuit or network that includes all of the characteristics of each device in the network (e.g. the S-parameters of each device) along with how each device is connected forming nodes and the sources in the system, it allows one to write a system of equations that define the system behavior. In other words, for a given frequency, one could solve:

$$\hat{G}\hat{v}=\hat{e} \tag{1}$$

where $\hat{G}$ consists mostly of S-parameters and describes the system characteristics, $\hat{v}$ is a vector containing nodal values and $\hat{e}$ is a vector containing stimuli or forces applied to the circuit. These stimuli emanate from ports. The $\hat{x}$ notation is used to denote a special canonical form of these equations that match the yet to be described internal system description format. As will be described later, this special canonical form puts the nodes in the order that they are found in D and therefore defines the column ordering of $\hat{G}$. Furthermore, this special canonical form sets the equation ordering and therefore the row ordering of $\hat{G}$ and $\hat{e}$ to the same order as the node ordering. Said differently, each row r of the system of equations is an equation that defines the value of node $\hat{v}_r$ with respect to a stimulus value at $\hat{e}_r$ incident on that node. Traditionally, in simulation, one solves for the nodal values using the following equation:

$$\hat{v}=\hat{G}^{-1}\hat{e} \tag{2}$$

The present problem is different from the simulation problem in that one can know some of the nodal values ahead of time while other values are unknown. Furthermore, one knows some of the S-parameters of the devices in the system while others are unknown. In other words, one knows some of the values of $\hat{v}$ and $\hat{G}$ while others are unknown. Some of these nodal values are known because one is free to stimulate the system in any way that one sees fit in order to accomplish the objective. In other words, one can set $\hat{e}$ arbitrarily and because this stimulation will come from the system ports and the port-to-port relationships between the system ports are known, some of the nodal values are known.

To put the problem in a better form, one endeavors to reorder the rows and columns of $\hat{G}$. This reordering is accomplished by first making three lists of node names. First, a list vn is created which is simply a list of the node names corresponding to the elements in $\hat{v}$. Then, two other lists are created, one of the desired column ordering and another of the desired row ordering, called co and ro respectively. The total number of ports in the devices with unknown S-parameters is counted and designated as U and the total number of system ports is counted and designated as K. Then, co is formed by listing the names of the U nodes that represent waves that are incident on the unknown ports followed by the list of the U nodes that represent waves that are reflected from the unknown ports. This is followed with another L set of nodes that will be referred to after the final two lists. Following this yet to be described list of nodes is a list of the K nodes that represent waves that are incident on the system (i.e. emanate from a system port). And finally, the K nodes that represent waves that are reflected from the system. The middle set of nodes that were referred to earlier contain all other nodes that do not fit into any of the four categories mentioned. If the nodes in $\hat{v}$ are reordered to correspond with the ordering of co, then a new block vector of nodes v that represents nodal values are expressed as:

$$v=[a\,bu\,a_{msd}\,b_{msd}]^T \tag{3}$$

The notation $X^T$ represents the transpose of X. In (3), a and b are vectors of U nodal values representing the incident and reflected waves on the devices whose S-parameters are unknown and $a_{msd}$ and $b_{msd}$ are vectors of K nodal values representing the incident and reflected waves on the system whose S-parameters are known. The nodes that don't fall into these categories are in u. The vector co is a vector of the names of the nodes in v in this new order.

With this new column ordering, the row ordering vector ro is created whose names are the names of the nodes in the vector $v_r$, where:

$$v_r=[b\,a\,u\,a_{msd}\,b_{msd}]^T \tag{4}$$

Now, two permutation matrices $P_r$ and $P_c$ are created such that:

$$P_c\hat{v}=V \tag{5}$$

and:

$$P_r\hat{v}=v_r \tag{6}$$

and therefore:

$$P_r\hat{G}P_c^T P_c\hat{v}=P_r\hat{e} \tag{7}$$

Define:

$$G=P_r\hat{G}P_c^T \tag{8}$$

and:

$$e=P_r\hat{e} \tag{9}$$

and therefore:

$$Gv=e \tag{10}$$

It is important to recognize two things about the structure of (10). Observe that in $v_r$, block vector b appears first, meaning that the first U equations are for the reflected waves from the devices whose S-parameters are unknown. Further observe that in v, vector a appears first meaning that the first U nodes are for the incident waves on the devices whose S-parameters are unknown. This means that in G, the negative of the unknown S-parameters have been moved to the upper left portion. The second thing to note is the location of $a_{msd}$ and $b_{msd}$ in v and $v_r$. If one enters a 1 in a row of e corresponding to an element of $a_{msd}$ in $v_r$, then a column of the known S-parameters appears in the vector $b_{msd}$ in vector v.

With this knowledge, some redefinitions are made. Specifically matrix G becomes a block matrix and vectors v and e become block vectors. Since things are getting confusing with regard to matrix dimensions, a special notation is used whereby $$\underset{R\times C}{H}$$

refers to a block matrix H that has R rows and C columns. This nomenclature is used only once with the understanding that these sizes apply to all block matrices and vectors going forward. Note also, that the known S-parameters of the overall system are now designated as $S_k$ and the unknown S-parameters are designated as $S_u$:

$$e = \begin{bmatrix} \underset{U\times K}{0} & \underset{U\times K}{0} & \underset{L\times K}{0} & \underset{K\times K}{I} & \underset{K\times K}{0} \end{bmatrix}^T \tag{11}$$

$$v = \begin{bmatrix} \underset{U\times K}{A} & \underset{U\times K}{B} & \underset{L\times K}{U} & \underset{K\times K}{A_{msd}} & \underset{K\times K}{S_k} \end{bmatrix}^T \tag{12}$$

-continued $$G = \begin{bmatrix} -S_u & G_{01} & G_{02} & G_{03} & G_{04} \\ {}_{U \times U} & {}_{U \times U} & {}_{U \times L} & {}_{U \times K} & {}_{U \times K} \\ G_{10} & G_{11} & G_{12} & G_{13} & G_{14} \\ {}_{U \times U} & {}_{U \times U} & {}_{U \times L} & {}_{U \times K} & {}_{U \times K} \\ G_{20} & G_{21} & G_{22} & G_{23} & G_{24} \\ {}_{L \times U} & {}_{L \times U} & {}_{L \times L} & {}_{L \times K} & {}_{L \times K} \\ G_{30} & G_{31} & G_{32} & G_{33} & G_{34} \\ {}_{K \times U} & {}_{K \times U} & {}_{K \times L} & {}_{K \times K} & {}_{K \times K} \\ G_{40} & G_{41} & G_{42} & G_{43} & G_{44} \\ {}_{K \times U} & {}_{K \times U} & {}_{K \times L} & {}_{K \times K} & {}_{K \times K} \end{bmatrix} \quad (13)$$

With these new definitions, G and v are separated into known and unknown $$x = [A \quad B \quad U \quad A_{msd} \quad 0]^T \quad (14)$$

$$b = [0 \quad 0 \quad 0 \quad 0 \quad S_k]^T \quad (15)$$

$$E = \begin{bmatrix} 0 & G_{01} & G_{02} & G_{03} & G_{04} \\ G_{10} & G_{11} & G_{12} & G_{13} & G_{14} \\ G_{20} & G_{21} & G_{22} & G_{23} & G_{24} \\ G_{30} & G_{31} & G_{32} & G_{33} & G_{34} \\ G_{40} & G_{41} & G_{42} & G_{43} & G_{44} \end{bmatrix} \quad (16)$$

$$S = \begin{bmatrix} S_u & 0 & 0 & 0 & 0 \\ 0 & 0 & 0 & 0 & 0 \\ 0 & 0 & 0 & 0 & 0 \\ 0 & 0 & 0 & 0 & 0 \\ 0 & 0 & 0 & 0 & 0 \end{bmatrix} \quad (17)$$

Such that:

$$(-S+E)(x+b) = e \quad (18)$$

(18) is expanded and multiplied from the left by $E^{-1}$ (noting that $Sb=0$):

$$-E^{-1}Sx + x + b = E^{-1}e \quad (19)$$

Define the vector of block matrices:

$$y = Sx = [B0000]^T \quad (20)$$

and:

$$d = E^{-1}e - b \quad (21)$$

Note the structure of y that puts B in the top element of y and d which is a vector of wholly known block matrices. Substituting (20) and (21) in (19), one obtains:

$$-E^{-1}y + x = d \quad (22)$$

Define $Ei = E^{-1}$, the upper-left U by U matrix in Ei as $Ei_{00}$, the lower-left K by U matrix in Ei as $Ei_{40}$, the upper U by K matrix in d as $d_0$, and the lower K by K matrix in d as $d_4$. Note that the upper U by K matrix in y is B and that the upper U by K matrix in x is A and that the lower K by K matrix in x is 0. Therefore:

$$-Ei_{40}B + 0 = d_4 \quad (23)$$

and therefore:

$$B = -Ei_{40}^\dagger d_4 \quad (24)$$

The notation $X^\dagger$ represents the pseudoinverse of X. If $$X = \begin{bmatrix} U_{11} & U_{12} \\ U_{21} & U_{22} \end{bmatrix} \begin{bmatrix} \Sigma_r & 0 \\ 0 & 0 \end{bmatrix} \begin{bmatrix} V_{11}^H & V_{21}^H \\ V_{12}^H & V_{22}^H \end{bmatrix}$$

is the singular value decomposition (SVD) of X, then the pseudoinverse is given by $$X^\dagger = \begin{bmatrix} V_{11} & V_{12} \\ V_{21} & V_{22} \end{bmatrix} \begin{bmatrix} \Sigma_r^{-1} & 0 \\ 0 & 0 \end{bmatrix} \begin{bmatrix} U_{11}^H & U_{21}^H \\ U_{12}^H & U_{22}^H \end{bmatrix}.$$

Here $X^H$ represents the Hermitian or conjugate transpose of X. $\Sigma_r$ is a diagonal matrix of r non-zero singular values for a rank-r matrix X. When X is square and full rank, $X^\dagger = X^{-1}$. When the number of rows of X exceeds the number of columns, and X has full column rank, $X^\dagger = (X^H X)^{-1} X^H$. When the number of columns of X exceeds the number of rows and has full row rank, $X^\dagger = X^H (XX^H)^{-1}$. When solving an equation of the form $XA = B$, as in (24), then $A = X^\dagger B = (X^H X)^{-1} X^H B$ is a least squares solution; $A = X^\dagger B = X^H (XX^H)^{-1} B$ is a minimum norm solution; $A = X^{-1} B$ is an exact solution. When solving an equation of the form $AX = B$, as will be encountered elsewhere, then $A = BX^\dagger = B(X^H X)^{-1} X^H$ is a minimum norm solution; $A = BX^\dagger = BX^H (XX^H)^{-1}$ is a least squares solution; $A = BX^{-1}$ is an exact solution. The solution in terms of pseudoinverse should be considered as notational. For example, for square matrices, LU decomposition of a matrix is computed instead of the inverse. And for non-square matrices, QR factorization of the matrix can be used instead of SVD. More information about the pseudoinverse and algorithms for solving linear equations and for dealing with rank deficient matrices can be found by reading: Carl Meyer, Matrix Analysis and Applied Linear Algebra. SIAM: Society for Industrial and Applied Mathematics, February 2001. pages 422-425.

Now, reexamine (21) and remember that $e_3 = I$ and that e is zero elsewhere, so:

$$d_4 = Ei_{43}I - S_k \quad (25)$$

and therefore:

$$B = -Ei_{40}^\dagger (Ei_{43} - S_k) \quad (26)$$

Also, from (22):

$$-Ei_{00}B + A = d_0 \quad (27)$$

and therefore, now knowing B:

$$A = d_0 + Ei_{00}B \quad (28)$$

Again reexamine (21) and see that:

$$d_0 = Ei_{03} \quad (29)$$

and therefore:

$$A = Ei_{03} + Ei_{00}B \quad (30)$$

One now has an equation for the unknown S-parameters $S_u$ in terms of now known values A and B:

$$S_u A = B \quad (31)$$

All that remains is to solve for each of the devices whose S-parameters are unknown. $S_u$ is a block diagonal matrix where each block matrix on the diagonal represents the unknown S-parameters of the devices whose S-parameters are unknown. (if there were a single unknown element, $S_u$ represents the unknown S-parameters of that single device). The equations can be put in block form as:

$$\begin{bmatrix} S_{u0} & 0 & \cdots & 0 \\ P_0 \times P_0 & P_0 \times P_1 & & P_0 \times P_M \\ 0 & S_{u1} & \cdots & 0 \\ P_1 \times P_0 & P_1 \times P_1 & & P_1 \times P_M \\ \vdots & \vdots & \ddots & \vdots \\ 0 & 0 & \cdots & S_{uM} \\ P_M \times P_0 & P_M \times P_1 & & P_M \times P_M \end{bmatrix} \begin{bmatrix} A_0 \\ P_0 \times K \\ A_1 \\ P_1 \times K \\ \vdots \\ A_M \\ P_M \times K \end{bmatrix} = \begin{bmatrix} B_0 \\ P_0 \times K \\ B_1 \\ P_1 \times K \\ \vdots \\ B_M \\ P_M \times K \end{bmatrix} \quad (32)$$

where M+1 is the total number of devices whose S-parameters are unknown and $P_m$ represents the number of ports in unknown device m.

The solution for the S-parameter values for each device m is given by:

$$S_{um} = B_m A_m^\dagger \quad (33)$$

The pseudoinverse in (24), (26) and (33) is used because, according to the present method, K might be larger than U. In other words, the present method handles the over-constrained case in which there are more measurements of known system S-parameters then unknown device S-parameters. In the case that K is greater than U, the solution is the best possible solution in a least-squares sense.

Furthermore, the use of (33) handles a further constraint that the present method handles—that of multiple devices whose S-parameters are unknown. The added complexity stems from the fact that many multiple unknown devices can be viewed conceptually as one large unknown device whereby several of the interconnections within this known larger device are fixed to zero, hence the block diagonal matrix in (32).

The derivation took several opportunities to point out various items necessary to show the correctness of the logic. Therefore, one might have lost the appreciation for the simplicity of using the resulting algorithm in practice. The steps of finding the S-parameters of one or more unknown devices in a system are therefore described succinctly in FIG. 1.

The following are definitions regarding elements in this calculation. At early stages in the algorithm definition, a notion of a canonical form of a system characteristics matrix $\hat{G}$ was introduced, but later it was found that this matrix, in accordance with the present method, consists of a combination of known and unknown quantities. Later, this matrix was reordered to form a system characteristics matrix G and further split into the matrix containing unknown quantities S and known quantities E. Let's now use the definition $\hat{E}$ as being the known system characteristics matrix in canonical form and E as the known system characteristics matrix, since the algorithm can actually only operate on known quantities. The understanding is that $\hat{E}$ is simply $\hat{G}$ except that all locations in $\hat{G}$ that would contain unknown S-parameters are set to zero. It is clear that since the devices whose S-parameters are unknown are indicated in D, that $\hat{E}$ and E can be directly generated from D as the matrix permutations derived apply equally to $\hat{E}$ and E.

While this algorithm is certainly efficient, there are more efficiencies possible. If one examines the structure of E that appears in (16), one finds that it has the following structure:

$$E = \begin{bmatrix} 0 & I & 0 & 0 & 0 \\ I & E_{11} & E_{12} & E_{13} & 0 \\ 0 & E_{21} & E_{22} & E_{23} & 0 \\ 0 & 0 & 0 & I & 0 \\ 0 & E_{41} & E_{42} & 0 & I \end{bmatrix} \quad (34)$$

In (34), $E_{11}$, $E_{12}$, $E_{13}$, $E_{21}$, $E_{22}$, $E_{23}$, $E_{41}$ and $E_{42}$ represent block matrices with some or all non-zero elements, depending on the nature of the de-embedding problem. This means that the following predefined matrices could be calculated in an even more efficient manner than previously described:

$$Ei_{00} = E_{12} E_{22}^{-1} E_{21} - E_{11} \quad (35)$$

$$Ei_{03} = E_{12} E_{22}^{-1} E_{23} - E_{13} \quad (36)$$

$$Ei_{40} = E_{42} E_{22}^{-1} E_{21} - E_{41} \quad (37)$$

$$Ei_{43} = E_{42} E_{22}^{-1} E_{23} \quad (38)$$

One can see that this calculation involves one inversion of an L by L matrix, and 6 matrix multiplications.

For the case when L is zero, the matrices appearing in the third block row and third block column of matrix E in equation (34) are empty matrices. In this case the products $E_{12} E_{22}^{-1} E_{21}$, $E_{12} E_{22}^{-1} E_{23}$, $E_{42} E_{22}^{-1} E_{21}$, and $E_{42} E_{22}^{-1} E_{21}$ are treated as a zero matrix of appropriate size.

With this mathematical derivation in hand, all that is required is to show what a system description D is and how one obtains it. A preferred embodiment for generation of such a system will now be described.

In accordance with the invention, one preferably starts with the well known concept of a net-list. A net-list is simply a circuit description rendered usually in text form. Net-lists are simply another description of something graphical. For the purposes of this problem, the graphical problem is a network containing various network elements called devices with the ports of the devices interconnected as nodes and where some of the nodes are labeled as system ports. Each device is named and the properties of the device describe it's characteristics (i.e. it's S-parameters). An example of a description of a potential de-embedding problem is shown in FIG. 2. While this detailed description will work through this sample problem, it shall be clear that the present method is not limited to the solution of this specific problem, but instead serves to provide a method of solution for any variety of such problems. The de-embedding problem in FIG. 2 is one of finding the S-parameters of a single unknown two-port element [3] given two fixtures with known S-parameters [1] and [2], four ports [4], [5], [6] and [7], the known S-parameters of the entire system with respect to these ports [12], and the interconnections as shown designated by the lines and dots defining the upper node [8] and the lower node [9].

From this diagram, a net-list is exported. Again, a net-list is simply text or some other agreed upon format that describes the drawing. A net-list corresponding to FIG. 2 is shown in FIG. 3. Here, one sees three device declarations [13], [14] and [15], four port declarations [16], [17], [18] and [19], and two node declarations [20], and [21]. It is obvious how this net-list in FIG. 3 contains all of the information required to describe FIG. 2.

Figure 4:
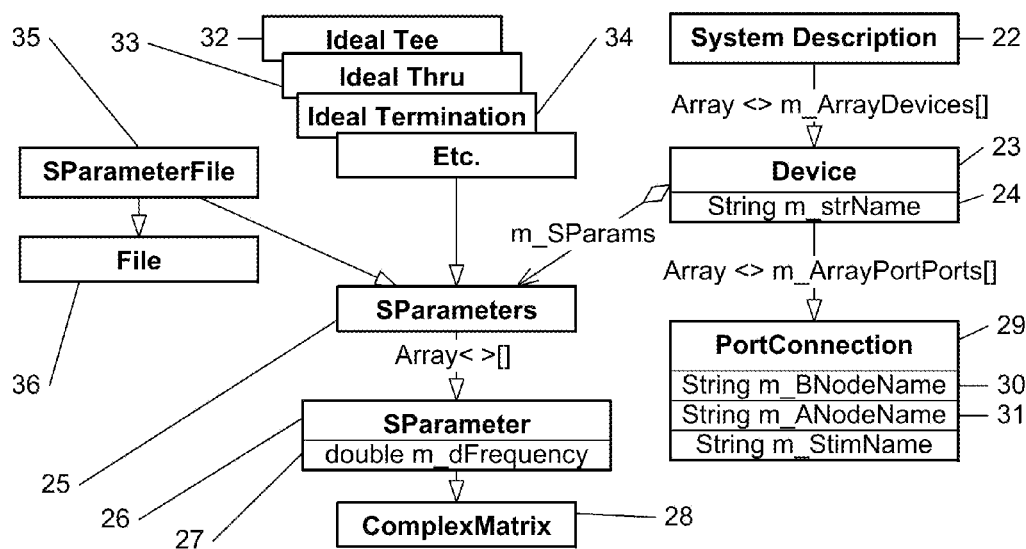
FIG. 4 is a Unified Modeling Language (UML) Diagram defining the internal structure of a system description in accordance with the preferred embodiment of the invention.

At this point, it is important to describe the internal structure of the system description. FIG. 4 is a UML diagram that shows an internal structure. UML diagrams are well known to those familiar with object-oriented programming. Briefly, it states that a system description [22] is an array of devices [23]

and that a device has a name [24] and has S-parameters [25] and is an array of ports [29]; that a port has an A node name [30] and a B node name [31]; that S-parameters are an array of S-parameter [26] where each instance of S-parameter [26] has a frequency [27] and is a complex matrix [28]; that there are many classes that are S-parameters [25] including some ideal types of devices such as the ideal tee [32], the ideal thru [33] and the ideal termination [34] as well as others; that an S-parameter file [35], which is also a file [36], is also S-parameters [25].

The subsequent description will use a C++ language style object-oriented nomenclature that defines the access to the elements in this structure as follows:

Access to a member of an object is referred to by preceding the member name with a ".". For example, "C.Port" refers to the member named "Port" of a class instance "C".

S-parameters are usually referred to using an indexing notation that begins with one. For example $S_{21}$ refers to the reflected wave from port 2 due to an incident wave on port 1. This document refers to S-parameters in this manner, however the data structures utilized are indexed using zero as the starting value. In other words, in the previous example, if the S-parameters at a given frequency are contained in a variable "s", then $S_{21}$ would be accessed as [1][0].

The access to data in the system description is worth clarifying:

D is the system description structure.
D.Num is the number of devices.
D[d] refers to device d.
D[d].Name refers to the name of device d.
D[d].Port refers to the ports of device d.
D[d].Port.Num refers to the number of ports in device d.
D[d].Port[p] refers to port p of device d.
D[d].Port[p].A refers to the name of the node of the wave incident on port p of device d.
D[d].Port[p].B refers to the name of the node of the wave reflected from port p of device d.
D[d].S refers to the complete set of S-parameters of device d.
D[d].S.Num refers to the number of frequency points in the set of S-parameters of device d.
D[d].S[n] refers to the S-parameters of device d at frequency point n.
D[d].S[n][o] [ ] refers to the reflected wave from port o due to an incident wave on port i of device d at frequency point n.

A function that will be used so often that it is worth defining upfront is the index function; index (e, v) returns the index of vector v containing the element e.

An internal system description is created by parsing a net-list file as exemplified by FIG. 3. This example net-list corresponds to the graphical description in FIG. 2. There are only three keywords: Device, Port and Node.

The Device keyword adds a device to the system description array of devices. It adds a device instance. The device instance, which is an array of ports, is dimensioned to the size specified by the number of ports. The A and B node names are set to empty strings. The S-parameters are either generated (if an ideal type is specified) or read from a file. If the device is specified as an unknown device, all S-parameters are set to zero. The device name is set to the device name specified.

The Port keyword adds two new devices to the system description array of devices. It adds a one-port ideal termination with the name "P" concatenated with the port number specified. It also adds a two-port ideal thru device with the name "TP" concatenated with the port number specified. The actual name of the thru and termination is not important, only that it is unique. The single-port ideal termination is then connected to port 1 of the ideal thru, and port 2 of the ideal thru is connected to the port specified of the device whose name is specified. The nodal connections are given some unique name. Nodal connections are described in the next paragraph. It is important to understand that a port declaration always involves a nodal connection in a similar manner as a yet to be defined node declaration. A single-port ideal termination has S-parameters of 0 everywhere. The S-parameters of a two-port ideal thru are:

$$S_{idealThru} = \begin{bmatrix} 0 & 1 \\ 1 & 0 \end{bmatrix} \qquad (39)$$

The ideal thru is used to ensure that a system port is never a port of the unknown device. The reason for this can be seen in (3) where the ordering of certain nodes are shown and where it shows that the system port nodes and the nodes of the unknown device(s) are separately listed. One could choose to examine the system to see if a thru is really necessary, but this would add complication. An arbitrary decision was made here to avoid this complication.

The Node keyword, in principal, connects two device ports together. A device port is connected by setting one of the ports specified in one of the device's A node names to a node name concatenated with a "1" along with the corresponding B node name in the other specified port in the other specified device. Similarly the B node name of the specified port of the first specified device is set to the same node name concatenated with a "2" along with the corresponding A node name of the other specified port in the other specified device. Again, all that is really necessary is that the node names are unique and A nodes connect to a single B node of another device. There is one minor complexity here and it has to do with the dots in the graphical representation as in FIG. 2 and [11]. These dots lead to nodes that connect more than two device ports as can be seen in [20] and [21]. Only two device ports can actually ever be connected together, so when more than two device ports are specified for a node, special processing is required that adds an ideal tee device to the system description array of devices and connects all of the ports specified to this ideal tee device. A P-port ideal tee has S-parameters:

$$S_{idealTee} = \begin{bmatrix} 2-P & 2 & \cdots & 2 \\ 2 & 2-P & \cdots & 2 \\ \vdots & \vdots & \ddots & \vdots \\ 2 & 2 & \cdots & 2-P \end{bmatrix} \frac{1}{P} \qquad (40)$$

With the parsing of the net-list now described, when a net-list as shown in FIG. 3 is parsed, the result is shown in FIG. 5. This exemplifies the internal meaning of a system description. The system description defines a system of equations for each frequency point. For each frequency point, one has a system characteristics matrix in canonical form $\hat{G}$, a node vector $\hat{v}$, and a stimulus vector $\hat{e}$. $\hat{G}$ consists mostly of complex values mostly related to the S-parameters of the devices. vn contains a list of node names. $\hat{e}$ contains the stimulus applied to the node.

Figure 7:
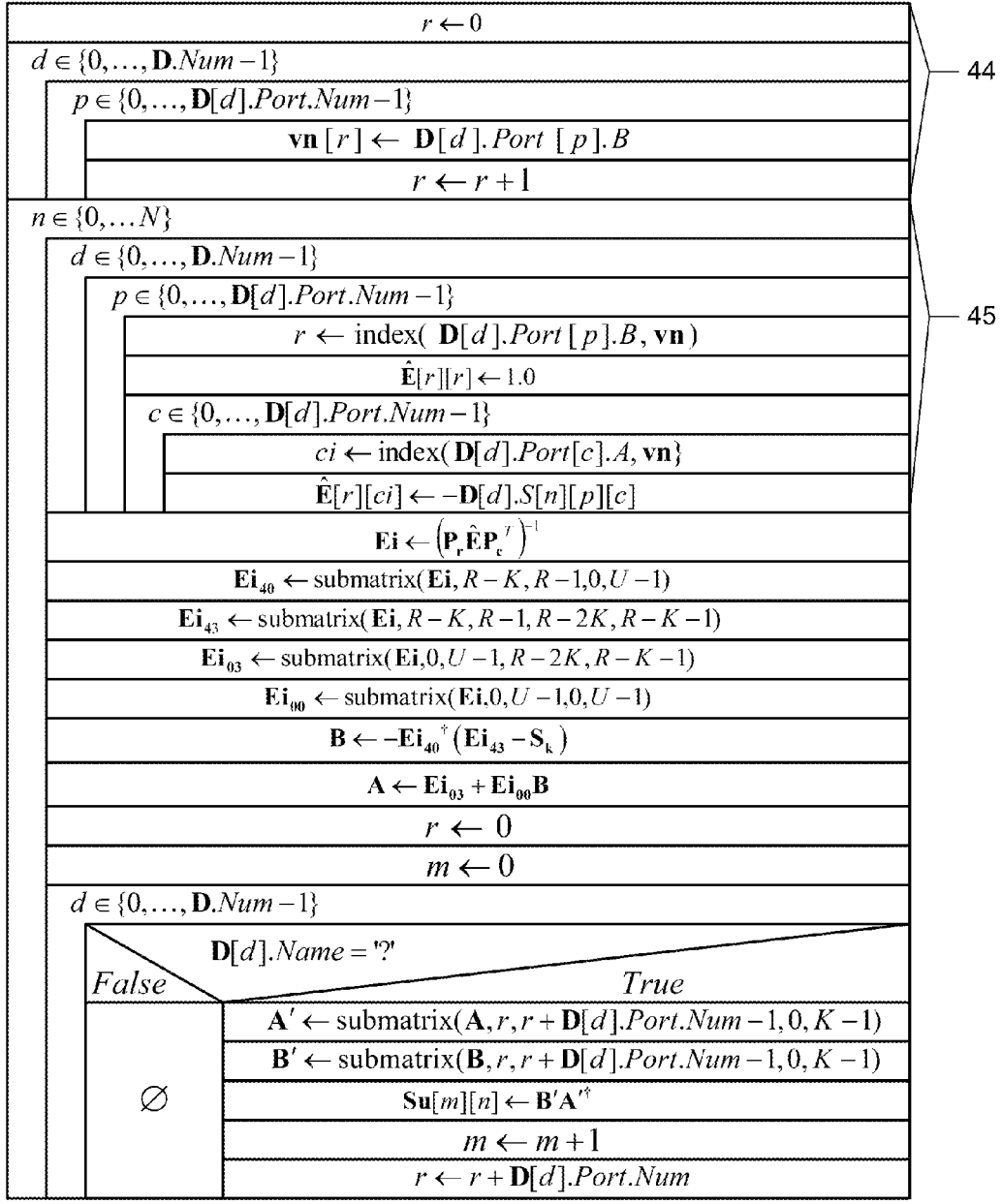
FIG. 7 is a Nassi-Schneiderman (NS) diagram representing the algorithm flow in accordance with the preferred embodiment of the invention.

The vector vn is found programmatically as [44] in FIG. 7.

Thus, for a given frequency point n, $\hat{G}$ and vn define a system of equations such that if all of the unknown S-parameters were filled in, the stimulus vector ê containing stimuli emanating from a B node would relate to the nodal values in $\hat{v}$ as $\hat{G}\hat{v}=\hat{e}$ where the nodal values in $\hat{v}$ and ê are identical and in the same order as the node names specified in vn. Note that vn is simply the names of the B nodes in order in the system description. For example, for the system description in FIG. 5, one has the names as shown in FIG. 6, [37].

Since the system characteristics matrix in canonical form consists of known and unknown quantities, it is split into a known and unknown portions. The known portion, the known system characteristics matrix in canonical form can be calculated after vn is calculated as matrix Ê shown being determined programmatically as [45] in FIG. 7.

The next step is to put these equations in a proper order. This is done by reordering the rows and columns. The desired column ordering is formed by creating a vector co that contains the elements of vn in the desired order. This order can be described by considering co as a block vector containing five blocks. The first block contains the names of all nodes connected to an A node of an unknown device. The second block contains the names of all nodes connected to a B node of an unknown device. The fourth block contains all of the names of all nodes connected to a B node of a device designated as a port. The fifth block contains all of the names of all nodes connected to an A node of a device designated as port. The third block contains all other nodes. Each vector in the block vector co is in the order it is found in the system description, except for the fourth and fifth block, whose elements are listed in the order of the system port numbering. In other words, the fourth and fifth blocks are listed in the order of the numbering of the devices designated as ports. An example column ordering vector is shown as [38], which corresponds to the system description in FIG. 5. Note that the nodes designated as $a_{msd}$ [40] are really B node names on the system ports. This is because reflected waves from the system ports are incident waves on the system. Similarly, nodes designated as $b_{msd}$ [41] are A node names on the system ports. This is because waves incident on the system ports are reflected waves from the system.

The row ordering vector ro is formed by interchanging the node names labeled A [42] and those labeled B [43].

While the description of the present method started with the algorithm derivation that begins with the system description D and proceeded to find the unknown S-parameters, it then proceeded to show how an internal system description D is generated. It is a simple matter to find the permutation matrices $P_c$ and $P_r$ that reorder the names in vn to form ro and co and therefore operate on Ê to form E. As a final note, understand that with the unknown S-parameters set to zero, G is in fact the matrix E.

The algorithm of the present method is shown in FIG. 7. In FIG. 7, the following constants and definitions are given:

D refers to a system description whose method of generation has already been described.

$P_c$ is the column permutation matrix whose method of calculation has been described previously.

$P_r$ is the row permutation matrix whose method of calculation has been described previously.

R represents the number of rows in vn and is the number of rows and columns in Ê and Ei.

K is the number of rows and columns in S-parameter matrices $S_k$ provided.

U is the number of total ports in the devices with unknown S-parameters.

N refers to the total number of frequency points which are N+1.

submatrix (A, $r_i$, $r_f$, $c_i$, $c_f$) returns the portion of the matrix from row $r_i$ to $r_f$ inclusive and from column $c_i$ to $c_f$ inclusive.

While this description relied on a specific example in order to better explain the method, it is clear that this method is not restricted to the example shown. In fact, the method is so general that it solves any de-embedding problem having known S-parameters as measured or calculated for the system ports and having one or more devices with unknown S-parameters. It will also solve systems containing mixtures of known and unknown elements provided the system can be described by specifying the known and unknown devices, their port-to-port interconnections, the connections between these known and unknown elements to system ports, and the characteristics of the known devices. While net-lists of a certain format were used here, it is obvious that other equivalent formats could be used. The same is true of the internal system description of which other obviously equivalent forms can be utilized. The only real limitation this method provides with regard to providing meaningful de-embedding results pertains to the nature of the networks and their interconnections. If elements exist in the network that limit or block signal flow through particular nodes, then the de-embedded result may degrade in value—but this limitation is not a limitation of the method, per se, but rather a limitation of the method of measurement. This degradation is easily understood by examining the condition numbers of all matrix whose pseudoinverse is taken in this method or by other means of examining the sensitivity of the de-embedded results to measurements made at the system ports. This method lends itself easily to empirical, Monte-Carlo style methods for determining such sensitivities since it makes the solution of the de-embedded results so routine. The present has no restrictions on the number of ports for the DUT and the fixtures nor any assumptions on the fixture model. Also, there are no restrictions on symmetry or any restrictions on circuit topology. Furthermore, the method of the present invention may be implemented on an oscilloscope, other test and measurement apparatus, or multipurpose computer properly configured for use in such a situation. Such an apparatus may include means for acquiring various input signals, or may obtain these measurements from an external apparatus and merely perform any processing in accordance with the present invention. In particular, the apparatus may be capable of determining one or more of the S-parameters for the system, or may be provided with all of the needed S-parameters. The method of the invention may be implemented as a computer program stored on a computer readable medium, stored in internal memory of any such apparatus, or be stored in any other appropriate manner.

There are many advantages that are apparent from the preceding description. While others are apparent, it is worthwhile to point out a few of them:

An algorithm is attained that describes all steps required for the calculation of unknown S-parameters. The algorithm is very compact and utilizes a minimum of computation. The algorithm does not distinguish between system topologies and does not deal with any particular system or topology in any different manner from another. Furthermore, utilization of the present method does not require any special information regarding topology aside from a simple description providing the interconnectedness of devices. The algorithm does not require the use of T-parameters or any other parametric conversions nor is it concerned with numbers of ports in the system or in unknown devices nor with whether the numbers are even or odd. It deals efficiently with over-constrained cases containing more known information in the form of known system S-parameters than unknown information. It deals efficiently with cases containing multiple devices whose S-parameters are unknown.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed:

1. A method for de-embedding at least one device whose S-parameters are unknown and including at least one unknown device port from a system having known system S-parameters at at least one system port, the system comprising, in addition to the at least one device whose S-parameters are unknown, at least one device whose S-parameters are known and including at least one known device port, at least one connection between the at least one system port and the at least one known device port; comprising the steps of:

describing the system in accordance with a system description, the system description further comprising a list of at least one or more devices, an indicator of a number of device ports and associated S-parameters if known, one or more system ports, and one or more nodes indicating a relationship between one or more of the one or more system ports and one or more device ports;

storing the system description to a first non-transient computer readable storage medium;

converting the system description and the known S-parameters of the at least one device whose S-parameters are known to a system characteristics matrix, the system characteristics matrix describing the linear relationship between all determined nodal wave values both incident on and reflected from one or more of the at least one or more device ports and stimuli in the system associated with one or more of the one or more system ports;

converting the system characteristics matrix and the known system S-parameters to determine the S-parameters of the at least one device whose S-parameters are unknown; and storing the determined s-parameters to a second non-transient computer readable storage medium.

2. The method of claim 1, further comprising the step of converting the system description to a system description having a predefined format before conversion.

3. The method of claim 1, wherein the system comprises at least a second device whose S-parameters are unknown and including at least one unknown device port.

4. The method of claim 1, wherein the number of system ports exceeds the number of unknown device ports.

5. The method of claim 1, wherein the system comprises at least a second device whose S-parameters are known and including at least one known device port.

6. The method of claim 1, wherein the system further comprises a node connecting at least three device ports.

7. The method of claim 1, wherein the system further comprises a node connecting at least three ports, wherein the at least three ports are selected from the group of known device ports, unknown device ports, and system ports.

8. The method of claim 1, wherein the system comprises an arbitrary number of ports.

9. The method of claim 1, wherein a relationship between a total number of ports, a number of known device ports, unknown device ports, and system ports is arbitrary.

10. A computer program stored on a non-transitory computer readable medium, and including instructions for de-embedding at least one device whose S-parameters are unknown and including at least one unknown device port from a system having known system S-parameters at least one system port, the system comprising, in addition to the at least one device whose S-parameters are unknown, at least one device whose S-parameters are known and including at least one known device port, at least one connection between the at least one system port and the at least one known device port; the instructions instructing a processing element to perform the steps of:

describing the system in accordance with a system description, the system description further comprising a list of at least one or more devices, an indicator of a number of device ports and associated S-parameters if known, one or more system ports, and one or more nodes indicating a relationship between one or more of the one or more system ports and one or more device ports;

converting the system description and the known S-parameters of the at least one device whose S-parameters are known to a system characteristics matrix, the system characteristics matrix describing the linear relationship between all determined nodal wave values both incident on and reflected from one or more of the at least one or more device ports and stimuli in the system associated with one or more of the one or more system ports; and converting the system characteristics matrix and the known system S-parameters to the S-parameters of the at least one device whose S-parameters are unknown.

11. The computer program of claim 10, further comprising the step of converting the system description to a system description having a predefined format before conversion.

12. The computer program of claim 10, wherein the system comprises at least a second device whose S-parameters are unknown and including at least one unknown device port.

13. The computer program of claim 10, wherein the number of system ports exceeds the number of unknown device ports.

14. The computer program of claim 10, wherein the system comprises at least a second device whose S-parameters are known and including at least one known device port.

15. The computer program of claim 10, wherein the system further comprises a node connecting at least three ports.

16. The computer program of claim 15, wherein the at least three ports are selected from the group of known device ports, unknown device ports, and system ports.

17. The computer program of claim 10, wherein the system comprises an arbitrary number of ports.

18. The computer program of claim 10, wherein a relationship between a total number of ports, a number of known device ports, unknown device ports, and system ports is arbitrary.

* * * * *